United States Patent
Tertinek et al.

(10) Patent No.: US 9,397,689 B2
(45) Date of Patent: Jul. 19, 2016

(54) INTERPOLATOR SYSTEMS AND METHODS

(71) Applicant: Intel Corporation, Santa Clara, CA (US)

(72) Inventors: Stefan Tertinek, Linz (AT); Thomas Mayer, Linz (AT); Peter Preyler, Weyer (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/551,266

(22) Filed: Nov. 24, 2014

(65) Prior Publication Data

US 2016/0149584 A1    May 26, 2016

(51) Int. Cl.
| | |
|---|---|
| *H03M 1/50* | (2006.01) |
| *H03M 1/82* | (2006.01) |
| *H03M 1/00* | (2006.01) |
| *H03M 1/70* | (2006.01) |
| *H03M 1/66* | (2006.01) |

(52) U.S. Cl.
CPC ................ *H03M 1/82* (2013.01); *H03M 1/002* (2013.01); *H03M 1/661* (2013.01); *H03M 1/70* (2013.01)

(58) Field of Classification Search
CPC ....... H03M 1/661; H03M 1/70; H03M 1/002; H03M 1/82
USPC ............................................ 341/166, 144, 152
See application file for complete search history.

(56) References Cited

U.S. PATENT DOCUMENTS

| | | | |
|---|---|---|---|
| 6,353,649 B1 | 3/2002 | Bockleman et al. | |
| 7,205,924 B2* | 4/2007 | Vemulapalli | .......... G04F 10/005 341/155 |
| 7,221,202 B1 | 5/2007 | Yayla | |
| 8,462,840 B2* | 6/2013 | Chen | ..................... H03M 1/661 375/239 |
| 8,988,262 B2* | 3/2015 | Miyashita | .............. H03K 5/131 341/152 |
| 2002/0060592 A1 | 5/2002 | Shimoda | |
| 2011/0001527 A1 | 1/2011 | Lee | |
| 2014/0176201 A1 | 6/2014 | Weltin-Wu et al. | |
| 2014/0253198 A1 | 9/2014 | Ma et al. | |

OTHER PUBLICATIONS

European Search Report, Application No. 15190314.3-1810, Dated Apr. 15, 2016.

* cited by examiner

*Primary Examiner* — Brian Young
(74) *Attorney, Agent, or Firm* — Eschweiler & Associates, LLC (57) ABSTRACT

A digital to time converter is disclosed and includes a code logic and an interpolator. The code logic is configured to receive a first phase signal and a second phase signal and generate a select signal according to the first phase signal and the second phase signal. The interpolator has a bank of inverters. The interpolator is configured to generate an interpolator signal based on the select signal and an input signal.

19 Claims, 8 Drawing Sheets

FIG. 1

PHASE DETECTOR

INTERPOLATOR SYSTEMS AND METHODS

BACKGROUND

Digital to time converters (DTCs) are typically used in radio frequency (RF) transceivers and similar systems. The DTC is used to detect and identify a time difference between two signals. The DTCs are used to generate modulated and unmodulated local oscillator (LO) signals, where an input signal is compared with a reference clock.

There are three characteristics of DTCs that are of significance; quantization resolution, frequency range, and power consumption. The quantization resolution determines how small of timing differences or variations a DTC is capable of detecting. The frequency range is the frequency of input signals that the DTC is capable of measuring. Power consumption is the amount of power consumed by the DTC during operation.

These characteristics tend to be at odds with each other. For example, obtaining a higher quantization resolution typically decreases the frequency range of the DTC and increases the power consumption.

What is needed is a technique to obtain relatively high quantization resolution for suitable frequency ranges and power consumption.

DETAILED DESCRIPTION

The systems and methods of this disclosure are described with reference to the attached drawing figures, wherein like reference numerals are used to refer to like elements throughout, and wherein the illustrated structures and devices are not necessarily drawn to scale.

Figure 1:
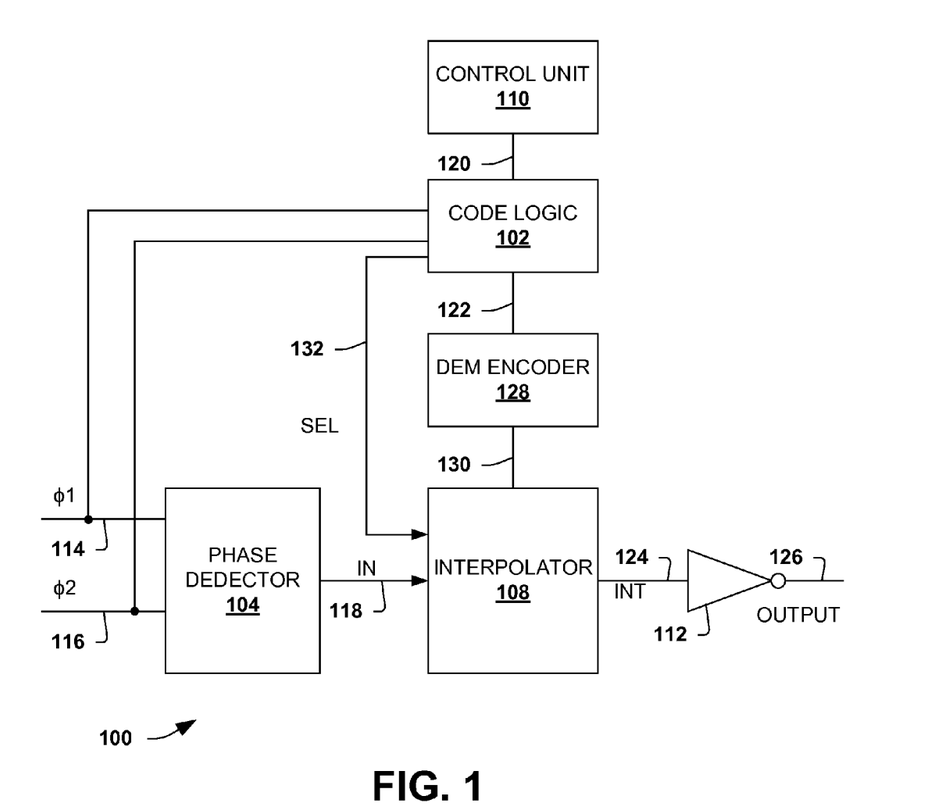
FIG. 1 is a diagram illustrating a digital to time converter system using an interpolator having a single bank of inverters.

FIG. 1 is a diagram illustrating a digital to time converter system 100 using an interpolator having a single bank of inverters. The system 100 selectively uses inverters of the bank to mitigate contention issues and power consumption.

The system 100 is provided in a somewhat simplified format in order to facilitate understanding. It is appreciated that suitable variations are contemplated.

Other approaches to digital to time converters (DTCs) require using an interpolator having two banks of N inverters. Each bank is connected to a phase signal. A number of the inverters are selected for interpolation and designated as n. Then, for interpolation, the first bank uses n inverters and the second bank uses N-n inverters. Thus, each bank typically has a varied number of active inverters, which leads to contention and/or other issues which degrade the operation of the DTC and reduce quantization resolution. The contention issues also lead to non-linearity and other problems.

The system 100 includes a phase detector 104, an interpolator 108, a control unit 110, code logic 102, an interpolator output inverter 112 and an encoder 128.

The phase detector 104 receives a first phase signal 114 and a second phase signal 116 and generates an interpolator input signal (IN) 118 based on the signals 114 and 116. Typically, the interpolator input signal 118 includes one of the phase signals 114 and 116, according to whichever is earlier. In one example, the phase detector 104 generates the interpolator input signal 118 as an exclusive OR (XOR) of the first phase signal 114 and the second phase signal 116, which is then input to a D flip flop that generates the interpolator input signal 118. It is appreciated that other suitable techniques for generating the interpolator input signal 118 can be used.

The phase signals 114 and 116 are signals that may have varied edge timing and/or frequencies. They can be generated as part of a communication system or other system where interpolation or time conversion between multiple signals is used. In one example, the first phase signal 114 is provided from a phase locked loop (PLL) and the second phase signal 116 is provided from a phase processing circuit of a transceiver/transmitter circuit.

The interpolator 108 receives the interpolator input signal 118, a select signal 132 and a code signal 130 and is configured to generate an interpolator signal (INT) 124. As described above, the interpolator input signal 118 is based on the first and second phase signals 114 and 116. The select signal 132 indicates a number of inverters to enable, typically referred to as "n" or "N". The code signal 130 determines or selects interpolation between the phase signals 114 and 116. The interpolator signal 124 interpolates between edges of the first and second phase signals 114 and 116 by generating interpolated edges. It is noted that the interpolated edges are typically delayed by a time constant, $t_{abs}$, from the edges of the first and second phase signals 114 and 116.

The slope of the interpolated edges is based on the number of enabled inverters, n, for when the first and second phase signals 114 and 116 are varied or not equal and a total number of inverters, referred to as N, are enabled when the first and second phase signals 114 and 116 are equal. The n inverters are also referred to as varied interpolating inverters and n is less than or equal to N.

The interpolator 108 includes the N inverters in a bank of inverters. The number N of inverters present in the bank can vary on implementation. In one example, there are 1024 inverters in the bank of inverters. The code signal 130, as stated above, selects or assigns the number of inverters of the bank, n, used as the varied interpolating inverters. The select signal 132 selects/enables all N inverters in the bank in a first state, where the phase signals are equal, and selects/enables n inverters in a second state, where the phase signals are not equal. The second state is also referred to as the varied interpolation state as the phase signals are not equal or varied in this state.

The interpolator output inverter 112 is coupled to the interpolator 108. The inverter 112 is configured to invert the interpolator output signal 124 in order to generate the converter output signal 126.

The code logic 102 is coupled to the interpolator 108. The code logic 102 is configured to generate the code signal 122 and the select signal 132. The code logic 102 includes circuitry that compares the first phase signal 114 with the second phase signal 116. If the phase signals 114 and 116 are varied, the system 100 is considered to be in the varied interpolation state and the select signal 132 is generated as enabled. If the phase signals 114 and 116 are equal, the select signal 132 is generated as disabled.

The code logic 102 also generates the code signal 122, which is typically a digital code word. The code signal 122 has a number of bits, such as 1 to 4, which are coded to select the number of varied interpolating inverters and thus the varied interpolation slope.

The control unit 110 is coupled to at least the code logic 102 and controls operation of the code logic 102. The control unit 110 generates a control signal 120, which is used to adjust or set the code word of the code signal 122.

The encoder 128 is a dynamic element matching (DEM) encoder and is configured to reduce effects of random mismatches. The encoder 128 is shown in the system 100; however, it is appreciated that the encoder 128 can be omitted from the system 100 and the code signal 122 simply supplied as the code signal 130.

The code logic 102 specifies that n inverters are enabled for interpolation when the phase signals are varied, while the code signal 130 (without the DEM encoder 128) specifies exactly which of the inverters are enabled: For a fixed n, always the same n inverters are enabled.

In contrast, for a fixed n specified by code logic 102, the DEM encoder 128 may change (for example, depending on a separate control signal) which of the inverters are enabled, so long as n are enabled. Given a bank of N inverters, the number of ways, disregarding order, to enable n inverters is given by the binomial coefficient "N choose n".

The general operation of the system 100 is as follows. If the first phase signal 114 is early, the first phase signal 114 is substantially used as the interpolator input signal 118. If the second phase signal 116 is early, the second phase signal 116 is substantially used as the interpolator input signal 118. The first phase signal 114 is deemed early upon an edge of the first phase signal 114 preceding an edge of the second phase signal 116. The second phase signal 116 is deemed early upon an edge of the second phase signal 116 preceding an edge of the first phase signal 114.

When the first phase signal 114 does not equal the second phase signal 116, the system 100 is in the varied interpolating state. As a result, the code logic enables the select signal 132 and supplies the code signal 122 selecting n inverters as the varied interpolating inverters. The encoder 128 can specify which of the inverters to enable.

The interpolator 108 uses the bank of inverters or inverter cells to generate the interpolator output signal 124 from the interpolator input signal 118, where the interpolator output signal 124 includes interpolated edges based on edges of the phase signals 114 and 116. Then, as described above, the inverter 112 inverts the interpolator output signal 124 to generate the converter output signal 126. Additionally, the inverter 112 sharpens the slope of interpolation edges in the converter output signal 126.

As shown above, the interpolator 108 performs the interpolation using a single bank of N inverters. Other approaches, as shown above, require using an interpolator having two banks of N inverters. Furthermore, using the single bank for the interpolator 108 mitigates non-linearity and other issues from occurring. Thus, the quantization resolution, frequency range, and power consumption are improved compared with the other approaches.

Figure 2:
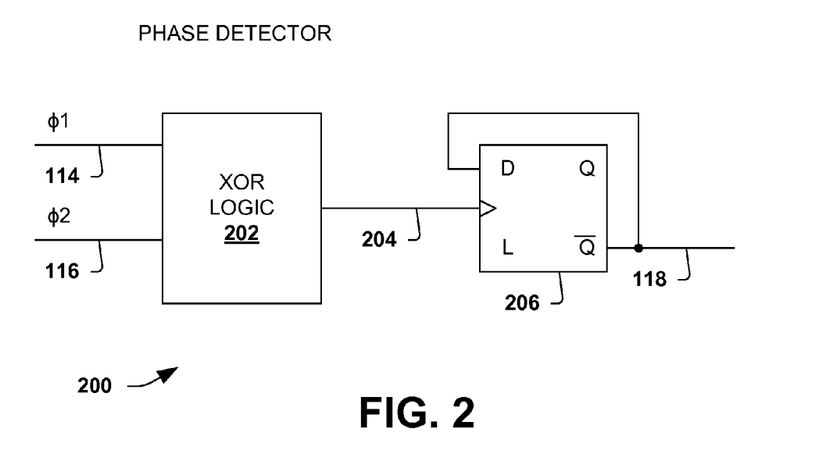
FIG. 2 is a diagram illustrating a phase detector.

FIG. 2 is a diagram illustrating a phase detector 200. The phase detector 200 can be used as the phase detector 104 within the system 100. The phase detector 200 is provided as an example and it is appreciated that suitable variations are contemplated.

The phase detector 200 includes an XOR logic 202 and a D flip flop 206. The phase detector 200 receives a first phase signal 114 and a second phase signal 116 and generates an interpolator output signal 118 based on the phase signals 114 and 116.

The XOR logic 202 receives the first phase signal 114 and the second phase signal 116 and generates an XOR output signal 204. The XOR logic 202 uses exclusive OR logic, XOR, to generate the output signal 204. Thus, when the phase signals 114 and 116 are varied, the output signal 204 is asserted high, in one example. Otherwise, the output signal 204 is asserted low.

The D flip flop 206 has a clock input, a D input, an output Q, and a complementary output Q. The clock input receives the XOR output signal 204. The complementary output Q generates the interpolator input signal 118. Additionally, the complementary output Q is also connected to its D input. Thus, the interpolator input signal 118 is used as feedback for the D flip flop 206.

Thus, the D flip flop 206 and the XOR logic 202 operate as a simple multiplexor. However, it is appreciated that other suitable phase detectors using similar and/or varied components are contemplated.

Figure 3:
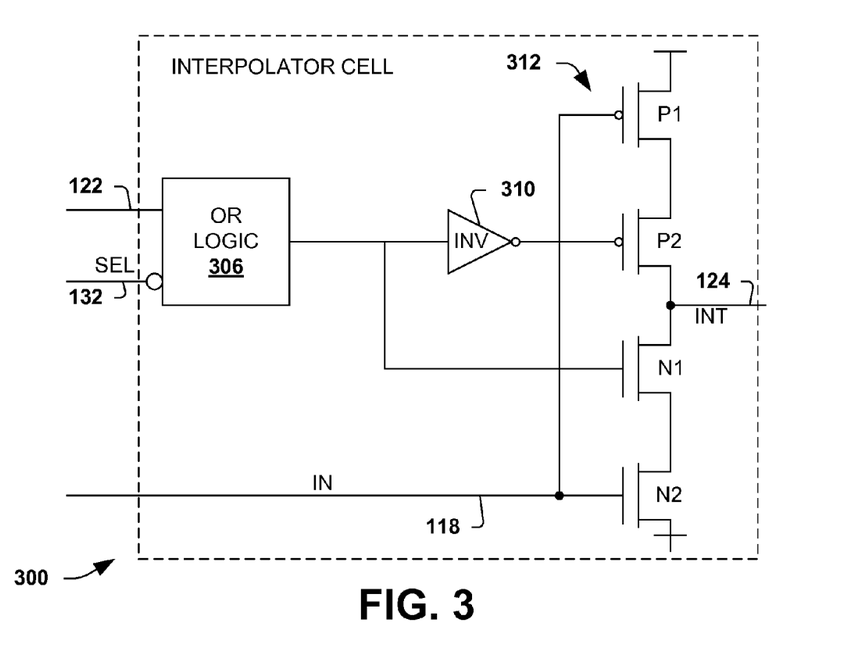
FIG. 3 is a diagram illustrating an interpolator cell having a single-interpolating inverter.

FIG. 3 is a diagram illustrating an interpolator cell 300 having a single interpolating inverter. The interpolator cell 300, as an example, can be used within the interpolator 108 in system 100, described above. The cell 300 is provided as an example of a suitable implementation, however it is appreciated that other implementations are contemplated.

The interpolator cell 300 includes OR logic 306, an inverter 310, and a series of transistors 312. There are a total of N interpolator cells within the interpolator 108 in system 100; however, only the interpolator cell 300 is shown for illustrative purposes. It is appreciated that the N interpolator cells are connected in a parallel.

The OR logic 306 receives the select signal 132 and the code signal 122. The code signal 122 indicates whether the cell 300 is to be enabled for the varied interpolation state, where the phase input signals are varied. The code signal 122 is specific to the cell 300 and is a single bit of a code word generated by code logic. The select signal 132 is also a single bit and indicates whether the phase signals are varied or equal. The OR logic 306 is configured to generate an OR of the signals 122 and 132 at its output, which is provided to the inverter 310. The inverter 310 inverts the output of the OR logic 306 and supplies it to the transistors 312.

The series of transistors 312 are configured to generate an interpolator cell output from the interpolator input signal 118. The series 312 includes a first PMOS transistor P1, a second PMOS transistor P2, a first NMOS transistor N1, and a second NMOS transistor N2. The series of transistors 312 drives or interpolates the interpolator output towards a supply voltage or ground voltage. The interpolator cell output is combined with the other interpolator cells to provide the interpolator output 124.

As one example, if the cell select signal 132 is de-asserted or set low, the transistors P2 and N1 are OFF and the cell/inverter is disabled. The transistors P2 and N1 are configured to enable or disable the cell and are referred to as enable transistors. Otherwise, if the interpolator input signal 118 is low, the interpolator output signal 124 is driven towards the supply voltage by transistors P1 and P2. If the interpolator input signal 118 is high, the interpolator output signal 124 is driven low by transistors N1 and N2.

Figure 4:
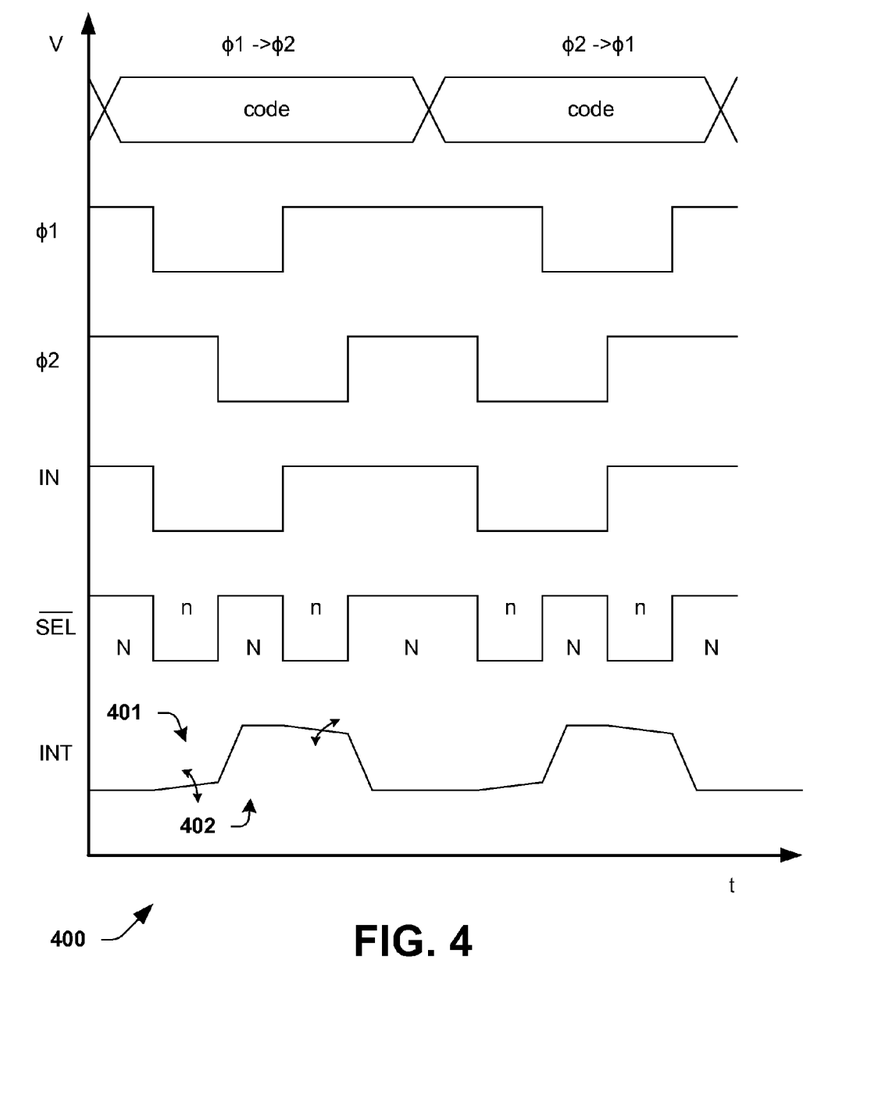
FIG. 4 is an example timing diagram for the DTC system.

FIG. 4 is an example timing diagram 400 for the DTC system 100. The system 100 can be implemented using cells including the interpolator cell 300 and the phase detector 200.

The diagram 400 is described in conjunction with FIGS. 1, 2 and 3 as well as their descriptions provided above. It is appreciated that the diagram 400 is provided as an example for illustrative purposes and that other timings and variations thereof are contemplated.

The timing diagram 400 depicts time along an x-axis and volts along a y-axis. A first phase signal is designated as φ1 and a second phase signal is designated as φ2 in the timing diagram 400. The timing diagram 400 illustrates a first portion where the first phase signal is early and a second portion where the second phase signal is early.

The interpolator input signal is designated as IN and follows the first phase signal during the first portion. Similarly, the interpolator input signal follows the second phase signal during the second portion. Thus, that first or early phase signal propagates through to the interpolator input signal.

A complement of the select signal, shown as SEL, is shown in the diagram 400. The complement signal is set to low on the first edge of the phase signals and is set to high on the second edge of the phase signals. The first edge corresponds to a first edge of the first phase signal and the second edge corresponds to a first edge of the second phase signal.

The complement of the select signal is shown overlaid with n or N, which designates the number of enabled inverters during that portion. Thus, when the first phase signal equals the second phase signal, the complement of the select signal is high and the number of interpolators enabled is N. When the first phase signal and the second phase signal are not equal or varied, the complement of the select signal is low and the number of interpolators enabled is n.

An interpolator output signal, designated as INT, interpolates between edges of the phase signals. The interpolator output signal is shown without an absolute time delay, described above as $t_{abs}$, for illustrative purposes.

The interpolator output signal is shown having varied slopes for when the phase signals are different and when they are equal. At 401, a rising interpolation edge is shown having a slope. At 401, the phase input signals are varied and n<N inverters are enabled. At 402, the interpolation edge is shown having a second, steeper slope. This second, steeper slope is due to N inverters being enabled and the interpolator output signal is seen rising more quickly until an upper limit is reached. Subsequently, a gradually decreasing slope is shown when the number of enabled inverters is n and a rapidly decreasing slope is shown when the number of enabled inverters is N.

Figure 5:
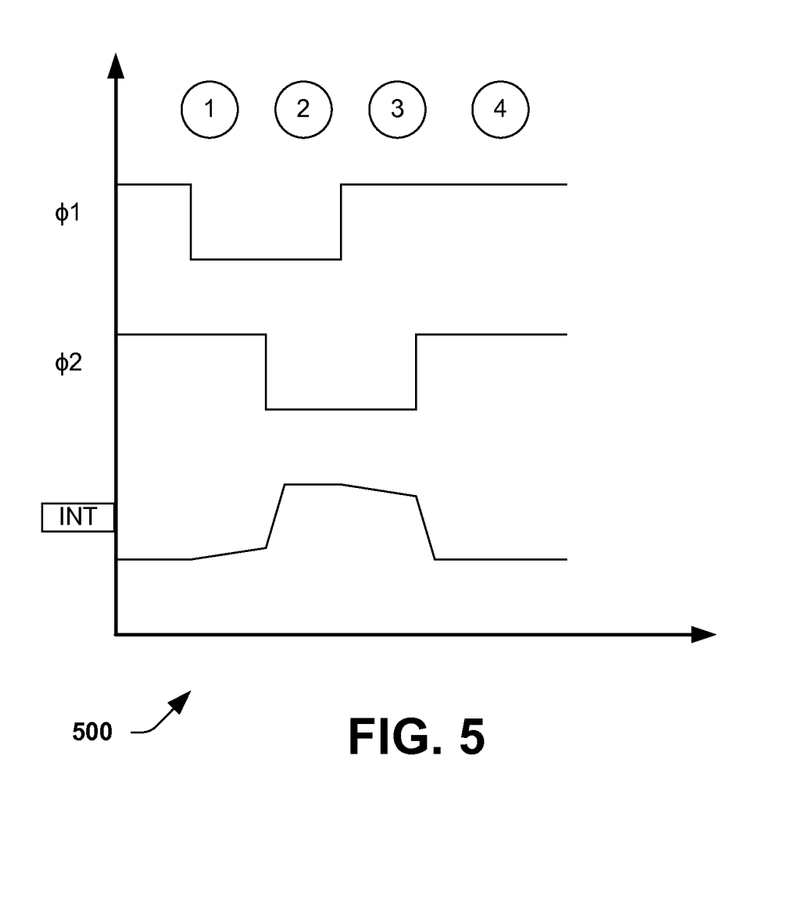
FIG. 5 is another timing diagram depicting an interpolator output signal at four different periods.

FIG. 5 is another timing diagram 500 depicting an interpolator output signal at four different periods. The timing diagram 500 is provided as an example to illustrate operation of digital to time converters, including, for example, the systems and components described above. Additionally, the timing diagram 500 is described in conjunction with FIG. 6.

The timing diagram 500 depicts time along an x-axis and volts along a y-axis. A first phase signal is designated as φ1 and a second phase signal is designated as φ2 in the timing diagram 500. An interpolation output signal, designated as INT, is also shown.

Figure 6:
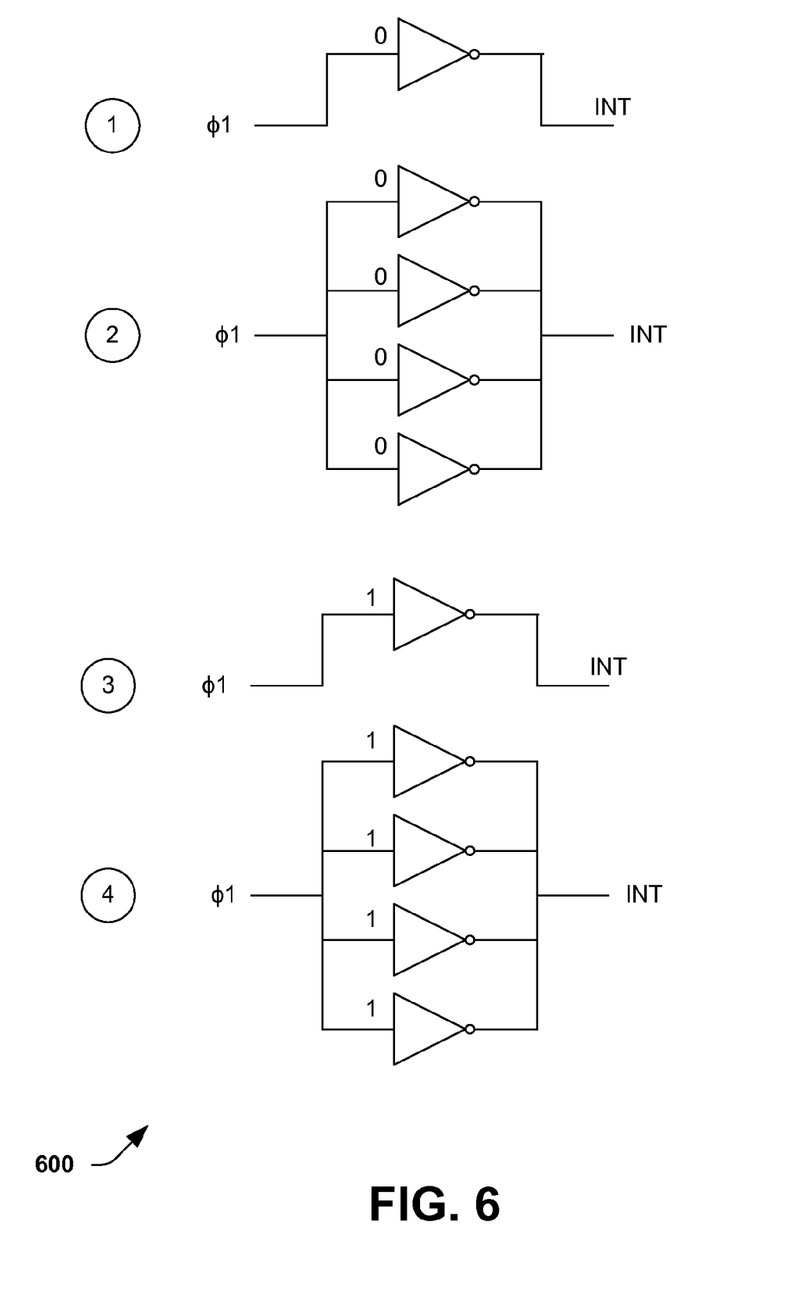
FIG. 6 is a diagram depicting operation of a bank of inverters of an interpolator.

FIG. 6 is a diagram depicting operation of a bank of inverters of an interpolator. The bank of inverters includes N total inverters/cells and has n inverters that are enabled for interpolating, while N-n are disabled during the interpolating. The inverter bank is described in conjunction with FIG. 5 at four periods of time. In this example, there are N=4 total inverters in the bank and n=1 varied interpolating inverters.

In a first period of time, (1), the first phase signal leads the second phase signal. Additionally, the first and second phase signals are varied, thus the interpolator is in the varied interpolating state and n=1 inverters are enabled as shown in FIG. 6. The first phase signal is low (0), thus the enabled inverter shown in (1) drives the interpolator output towards 1. The other N-n inverters are disabled and do not contribute to the interpolator output signal INT. Thus, as only one inverter is enabled, the interpolator output signal is driven to 1 at a small slope as shown in FIG. 5.

In a second period of time (2), the second phase signal has a high to low transition, thus both signals are equal and low. All N=4 inverters are enabled and the first phase signal, low (0), is applied to the N inverters. Thus, as all N inverters are enabled, the interpolator output signal is driven to 1 at a steep slope until it reaches its final value, which is high (1).

In a third period of time (3), the first phase signal has transitioned from low to high. Thus, the interpolator is in the varied interpolating state and only n inverters are enabled. The first phase signal is still leading so its value is applied to the enabled n inverters as shown in FIG. 6. The output of the inverter is driven towards low (0).

In a fourth period of time (4), the second phase signal has also transitioned from low to high. Thus, the first and second phase signals are in the high (1) state. N inverters are enabled and the first phase signal is applied to their inputs. The outputs of the inverters, and the interpolator output signal, are driven to low (0).

FIGS. 5 and 6 are described with the first phase signal being early and, therefore, applied to the inputs of the inverters. If the second phase signal is early, the operation is analogous except that the second phase signal is applied to the inverters.

Figure 7:
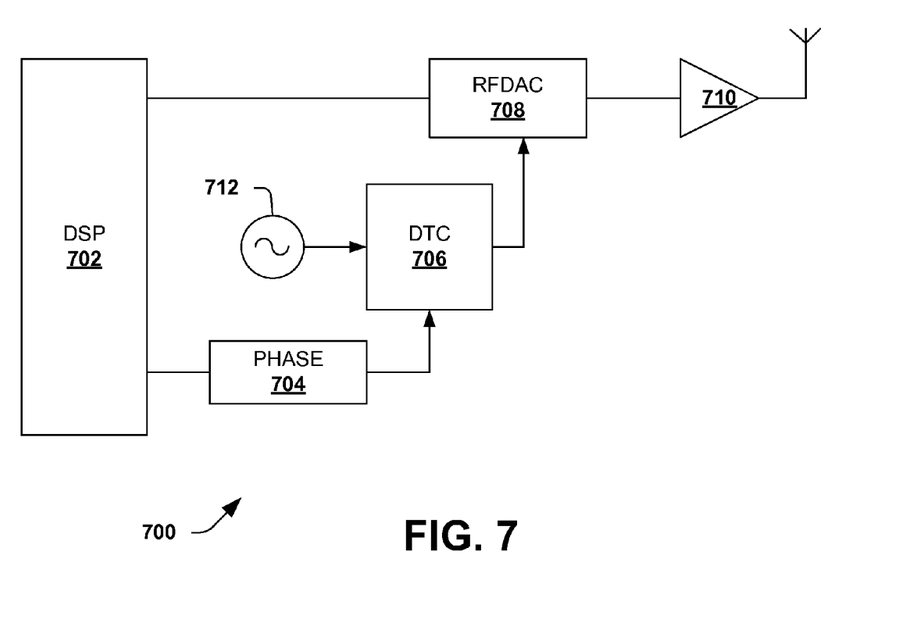
FIG. 7 is a diagram of a transmitter using a DTC having a single bank of N inverters.

FIG. 7 is a diagram of a transmitter 700 using a DTC having a single bank of N inverters. The transmitter 700 is provided for illustrative purposes and it is appreciated that variations are permitted.

The transmitter 700 includes a digital signal processing (DSP) component 702, a phase component 704, a single bank DTC 706, a phase locked loop (PLL) 712, an RF digital to analog converter (DAC) 708, and a power amplifier 710.

The DSP 702 converts data or a signal into a phase signal and an amplitude signal. The phase component 704 transitions the phase signal and provides the phase signal to the single bank DTC 706.

The DTC 706 receives a PLL signal on one of its inputs and a phase signal (code word) on another. The DTC 706 generates two edges in a coarse portion of the DTC 706. The coarse portion typically includes dividers and/or multiplexors. The two edges from the coarse portion are passed to an interpolator or fine DTC, such as the DTC 100, described above, which generates a converter output having a fine quantization resolution for the DTC 706.

The RFDAC converts the amplitude signal using the converter output signal into an RF signal. The RF signal thus includes both amplitude modulated information and phase modulated information. The RF signal is amplified by power amplifier 710 and can be provided for transmission, such as by an antenna.

The DTC 706 provides the converter output with enhanced linearity, higher quantization resolution and lower power consumption than other types of DTCs. As a result, the RF signal is generated with enhanced linearity and resolution.

Figure 8:
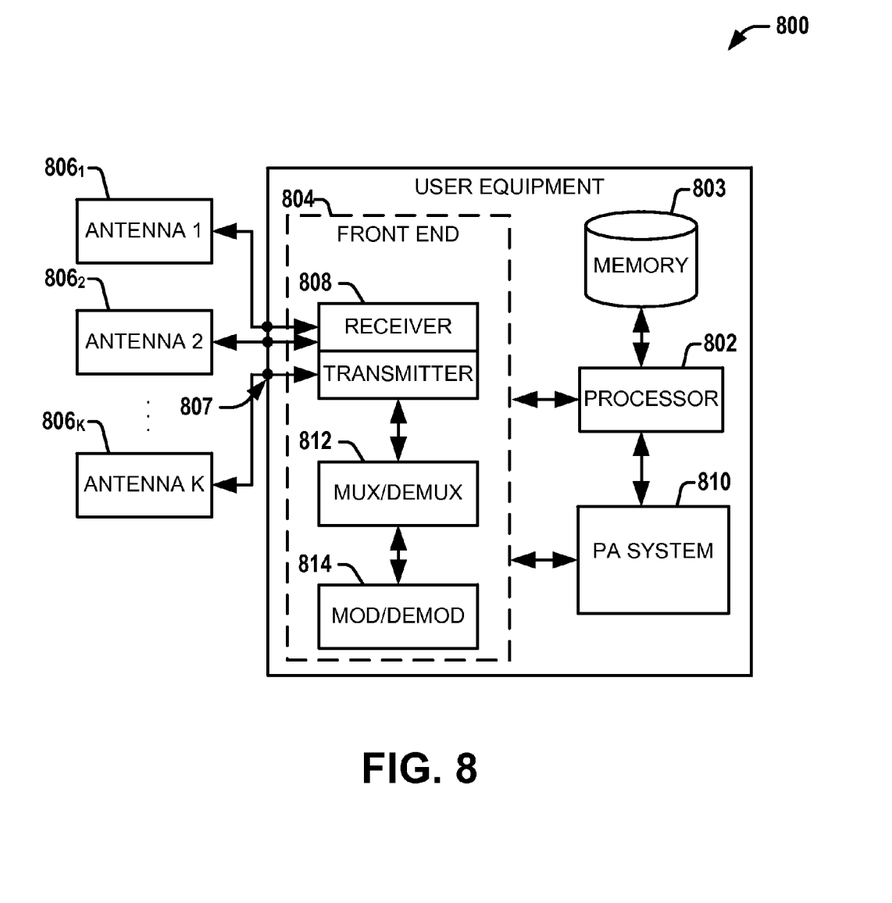
FIG. 8 is a diagram illustrating an exemplary user equipment or mobile communication device.

FIG. 8 is a diagram illustrating an exemplary user equipment or mobile communication device 800 that can be utilized with one or more aspects of the digital to time converters, transmitters and/or variations thereof, as described above.

The mobile communication device 800, for example, comprises a digital baseband processor 802 that can be coupled to a data store or memory 803, a front end 804 (e.g., an RF front end, an acoustic front end, or the other like front end) and a plurality of antenna ports 807 for connecting to a plurality of antennas 806$_1$ to 806$_k$ (k being a positive integer). The antennas 806$_1$ to 806$_k$ can receive and transmit signals to and from one or more wireless devices such as access points, access terminals, wireless ports, routers and so forth, which can operate within a radio access network or other communication network generated via a network device. The user equipment 800 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 804 can include a communication platform, which comprises electronic components and associated circuitry that provide for processing, manipulation or shaping of the received or transmitted signals via one or more receivers or transmitters 808, a mux/demux component 812, and a mod/demod component 814. The one or more transmitters 808 are configure to use a DTC having a single bank of N inverters, such as the converter 200 described above, which facilitates generation of the transmitted signals.

The front end 804, for example, is coupled to the digital baseband processor 802 and the set of antenna ports 807, in which the set of antennas 806$_1$ to 806$_k$ can be part of the front end.

The user equipment device 800 can also include a processor 802 or a controller that can operate to provide or control one or more components of the mobile device 800. For example, the processor 802 can confer functionality, at least in part, to substantially any electronic component within the mobile communication device 800, in accordance with aspects of the disclosure.

The processor 802 can operate to enable the mobile communication device 800 to process data (e.g., symbols, bits, or chips) for multiplexing/demultiplexing with the mux/demux component 812, or modulation/demodulation via the mod/demod component 814, such as implementing direct and inverse fast Fourier transforms, selection of modulation rates, selection of data packet formats, inter-packet times, etc. Memory 803 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 802 is functionally and/or communicatively coupled (e.g., through a memory bus) to memory 803 in order to store or retrieve information necessary to operate and confer functionality, at least in part, to communication platform or front end 804, the PA system 810 and substantially any other operational aspects of the PA system 810.

Figure 9:
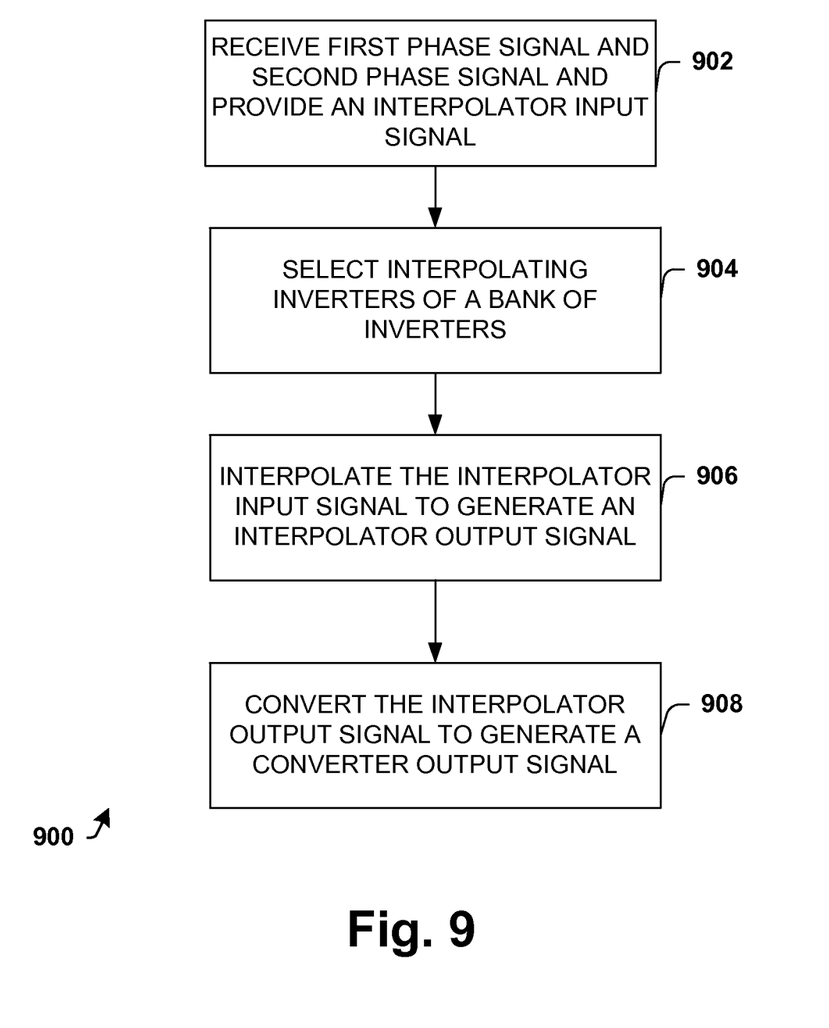
FIG. 9 is a flow diagram illustrating a method of operating a digital to time converter (DTC) using a single bank of inverters.

FIG. 9 is a flow diagram illustrating a method 900 of operating a digital to time converter (DTC) using a single bank of inverters. The method 900 uses a phase detector and code logic to generate a converter output having interpolated edges based on edges of input phase signals. The method 900 can be used within a transceiver for communication purposes and/or other applications.

The above converters and systems can be referenced and used with or in conjunction with the method 900.

A phase detector receives a first phase signal and a second phase signal at block 902 and provides an earlier of the first phase signal and the second phase signal as an interpolator input signal. The interpolator input signal is obtained, in one example, as an exclusive OR (XOR) of the first and second phase signals followed by a D flip flop operation on the output of the XOR, as shown above. The interpolator input signal, in another example, is the earlier of the phase signals. The earlier signal is determined as the signal having an edge, rising or lowering edge, that occur first.

A code logic selects interpolating inverters of a bank of inverters according to the first phase signal and the second phase signal at block 904. The code logic generates a code signal that selects one or more inverters of an inverter bank as varied interpolating inverters. Generally, upon the first and second phase signals being different, such as one low and the other high, the varied interpolating inverters are selected or enabled. Remaining inverters of the bank are de-selected or disabled, as described above. The number of varied interpolating inverters used determines a slope for an interpolation edge. The number of varied interpolating inverters, described above as "n", is typically specified with a digital word and is usually less than a total number of inverters "N" in the bank.

The code logic can have a predetermined number of inverters set for interpolation. Alternately, the number can be determined or modified during operation. Additionally, the number n can be provided by a control unit or other component.

The code logic can also be configured to use dynamic element matching to select which of the inverters in the bank to use as varied interpolating inverters.

The code logic is also configured to generate a select signal to enable interpolation. The select signal determines whether n or N inverters are used for interpolation.

An interpolator interpolates the interpolator input signal using the bank of inverters and the varied interpolating inverters to generate an interpolator output signal at block 906. The interpolator includes the bank of inverters and uses the inverters to perform the interpolation. The interpolator receives the interpolator input signal from the phase detectors and uses N or n of the inverters to perform interpolation, as directed by a code word or signal from the code logic. Additionally, the interpolator relies on the select signal to determine whether to use n or N inverters to perform the interpolation.

The interpolator generates the interpolator output signal having interpolated edges based on edges of the first and second phase signals. The interpolated edges are typically delayed by an absolute delay amount. This delay is introduced by the paths through which the signals travel.

An output inverter inverts the interpolator output signal to generate a converter output signal at block 908. The signal is inverted to track the first and second phase signals at the proper levels. The output inverter can introduce a delay into the signals. Thus, the converter output signal is generated and can be used in one or more suitable applications.

It is appreciated that the method 900 can be repeated at regular or irregular intervals.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

Examples may include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a digital to time converter, which includes a code logic and an interpolator. The code logic is configured to receive a first phase signal and a second phase signal and generate a select signal according to the first phase signal and the second phase signal. The interpolator has a bank of inverters. The interpolator is configured to generate an interpolator signal based on the select signal and an input signal.

Example 2 includes the subject matter of claim 1, where the converter further includes a phase detector. The phase detector is configured to generate the input signal based on the first phase signal and the second phase signal.

Example 3 includes the subject matter of any of Examples 1-2, including or omitting optional elements, where the phase detector is configured to generate the input signal as an exclusive OR of the first signal and the second signal used with a D flip-flop to generate the input signal at its output.

Example 4 includes the subject matter of any of Examples 1-3, including or omitting optional elements, where the phase detector is configured to generate an earlier signal of the first phase signal and the second phase signal as the input signal.

Example 5 includes the subject matter of any of Examples 1-4, including or omitting optional elements, where the code logic is configured to generate a code signal to select one or more varied interpolating inverters of the bank of inverters.

Example 6 includes the subject matter of any of Examples 1-5, including or omitting optional elements, wherein the code logic is configured to select which inverters of the bank of inverters to use as one or more varied interpolating inverters using dynamic element matching.

Example 7 includes the subject matter of any of Examples 1-6, including or omitting optional elements, where the bank of inverters includes a plurality of inverter cells.

Example 8 includes the subject matter of any of Examples 1-7, including or omitting optional elements, wherein the plurality of inverter cells each comprise enable logic and a series of transistors, wherein the enable logic is configured to enable the series of transistors and the series of transistors are configured to drive a cell output according to the input signal.

Example 9 includes the subject matter of any of Examples 1-8, including or omitting optional elements, where the enable logic includes an OR gate.

Example 10 includes the subject matter of any of Examples 1-9, including or omitting optional elements, further comprising an output inverter configured to invert the interpolator signal into a converter output signal.

Example 11 includes the subject matter of any of Examples 1-10, including or omitting optional elements, further comprising a control unit coupled to the code logic, wherein the control unit specifies a number n of inverters to use for interpolation.

Example 12 is an interpolator cell for a digital to time converter. The interpolator cell includes logic and a series of transistors. The logic is configured to receive a code signal and a select signal and to generate an enable signal upon the code signal or the select signal being enabled. The series of transistors is configured to drive a cell output according to an input signal upon the enable signal being generated.

Example 13 includes the subject matter of Example 12, including or omitting optional elements, where the series of transistors include one or more enable transistors configured to disable the cell output on the enable signal not being asserted.

Example 14 includes the subject matter of any of Examples 12-13, including or omitting optional elements, where the series of transistors include a p-type transistor configured to drive the cell output toward a supply voltage on the input signal being low.

Example 15 includes the subject matter of any of Examples 12-14, including or omitting optional elements, where the series of transistors include an n-type transistor configured to drive the cell output toward ground on the input signal being high.

Example 15 includes the subject matter of any of Examples 12-14, including or omitting optional elements, where the series of transistors include an n-type transistor configured to drive the cell output toward ground on the input signal being high.

Example 16 includes the subject matter of any of Examples 12-15, including or omitting optional elements, where the input signal is an output of a D flip-flop that receives an exclusive OR of a first phase signal and a second phase signal.

Example 17 includes the subject matter of any of Examples 12-16, including or omitting optional elements, further comprising a plurality of interpolator cells coupled to the cell output.

Example 18 includes the subject matter of any of Examples 12-17, including or omitting optional elements, further comprising an inverter coupled to the plurality of interpolator cells and configured to generate an interpolator output signal.

Example 19 is a method of operating a digital to time converter. An earlier of a first phase signal and a second phase signal is provided as an interpolator input signal. Varied interpolating inverters of a bank of inverters are selected according to the first phase signal and the second phase signal. The interpolator input signal is interpolated using the bank of inverters and the varied interpolating inverters to generate an interpolator output signal based on the interpolator input signal. The interpolator output signal is converted into a converter output signal.

Example 20 includes the subject matter of Examples 19, including or omitting optional elements, further comprising receiving a first phase signal and a second phase signal at a phase detector.

Example 21 includes the subject matter of any of Examples 19-20, further comprising interpolating the interpolator output signal using all inverters of the bank of inverters upon the first phase signal and the second phase signal being equal and/or interpolating the output signal using only the varied interpolating inverters upon the first phase signal and the second phase signal being varied.

Example 22 is a system having a means for providing interpolator input signal as an earlier signal of a first phase signal and a second phase signal. The system also includes a means for selecting varied interpolating inverters of a bank of inverters according to the first phase signal and the second phase signal. The system further includes a means for interpolating the interpolator input signal using the bank of inverters and the varied interpolating inverters to generate an interpolator output signal. The system also includes a means for converting the interpolator output signal into a converter output signal.

Example 22 includes the subject matter of Examples 22, including or omitting optional elements, where the system further includes a means for interpolating the interpolator output signal using all inverters of the bank of inverters upon the first phase signal and the second phase signal being equal or interpolating the output signal using only the varied interpolating inverters upon the first phase signal and the second phase signal being varied.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well.

Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. The component or structure includes a processer executing instructions in order to perform at least portions of the various functions. In addition, while a particular feature of the invention may have been disclosed with respect to only one of several implementations, such feature may be combined with one or more other features of the other implementations as may be desired and advantageous for any given or particular application.

Furthermore, to the extent that the terms "including", "includes", "having", "has", "with", or variants thereof are used in either the detailed description and the claims, such terms are intended to be inclusive in a manner similar to the term "comprising".

What is claimed is:

1. A digital to time converter comprising:
   a code logic configured to receive a first phase signal and a second phase signal and generate a select signal based on the first phase signal and the second phase signal;
   an interpolator comprising a bank of inverters and configured to generate an interpolator signal based on the select signal and an input signal; and
   a phase detector configured to generate the input signal based on the first phase signal and the second phase signal.

2. The converter of claim 1, wherein the phase detector is configured to generate the input signal as an exclusive OR of the first phase signal and the second phase signal used with a D-flip flop to generate the input signal at its output.

3. The converter of claim 1, wherein the phase detector is configured to generate an earlier signal of the first phase signal and the second phase signal as the input signal.

4. The converter of claim 1, wherein the code logic is configured to generate a code signal to select one or more varied interpolating inverters of the bank of inverters.

5. The converter of claim 1, wherein the code logic is configured to select which inverters of the bank of inverters to use as one or more varied interpolating inverters using dynamic element matching.

6. The converter of claim 1, wherein the bank of inverters includes a plurality of inverter cells.

7. The converter of claim 6, wherein the plurality of inverter cells each comprise enable logic and a series of transistors, wherein the enable logic is configured to enable the series of transistors and the series of transistors are configured to drive a cell output according to the input signal.

8. The converter of claim 7, wherein the enable logic includes an OR gate.

9. The converter of claim 1, further comprising an output inverter configured to invert the interpolator signal into a converter output signal.

10. The converter of claim 1, further comprising a control unit coupled to the code logic, wherein the control unit specifies a number n of inverters to use for interpolation.

11. An interpolator cell for a digital to time converter, the interpolator cell comprising:
    OR logic configured to receive a code signal and a select signal and to generate an enable signal upon the code signal or the select signal being enabled; and
    a series of transistors configured to drive a cell output according to an input signal upon the enable signal being generated.

12. The interpolator cell of claim 11, wherein the series of transistors include one or more enable transistors configured to disable the cell output on the enable signal not being asserted.

13. The interpolator cell of claim 11, wherein the series of transistors include a p-type transistor configured to drive the cell output toward a supply voltage on the input signal being low.

14. The interpolator cell of claim 11, wherein the series of transistors include an n-type transistor configured to drive the cell output toward ground on the input signal being high.

15. The interpolator cell of claim 11, wherein the input signal is an output of a D flip-flop that receives an exclusive OR of a first phase signal and a second phase signal.

16. The interpolator cell of claim 11, further comprising a plurality of interpolator cells coupled to the cell output.

17. A method of operating a digital to time converter, the method comprising:
    providing an earlier of a first phase signal and a second phase signal as an interpolator input signal;
    selecting varied interpolating inverters of a bank of inverters according to the first phase signal and the second phase signal;
    interpolating the interpolator input signal using the bank of inverters and the varied interpolating inverters to generate an interpolator output signal based on the interpolator input signal; and
    converting the interpolator output signal into a converter output signal.

18. The method of claim 17, further comprising receiving a first phase signal and a second phase signal at a phase detector.

19. The method of claim 17, further comprising interpolating the interpolator output signal using all inverters of the bank of inverters upon the first phase signal and the second phase signal being equal and interpolating the output signal using only the varied interpolating inverters upon the first phase signal and the second phase signal being varied.

* * * * *